United States Patent [19]
Gardner et al.

[11] Patent Number: 6,118,163
[45] Date of Patent: Sep. 12, 2000

[54] TRANSISTOR WITH INTEGRATED POLY/METAL GATE ELECTRODE

[75] Inventors: Mark I. Gardner, Cedar Creek; Derick J. Wristers, Austin; Jon D. Cheek, Round Rock, all of Tex.

[73] Assignee: Advanced Micro Devices, Inc., Sunnyvale, Calif.

[21] Appl. No.: 09/017,720

[22] Filed: Feb. 4, 1998

[51] Int. Cl.$^7$ .................................................. H01L 29/78
[52] U.S. Cl. .......................................... 257/412; 257/413
[58] Field of Search ..................................... 257/412, 413

[56] References Cited

U.S. PATENT DOCUMENTS

| | | | |
|---|---|---|---|
| 4,384,301 | 5/1983 | Tasch, Jr. et al. | 257/327 |
| 5,027,185 | 6/1991 | Liauh | 257/413 |
| 5,168,072 | 12/1992 | Moslehi | 257/327 |
| 5,498,570 | 3/1996 | Becker | 437/187 |
| 5,576,244 | 11/1996 | Hayashi et al. | 437/200 |
| 5,656,519 | 8/1997 | Mogami | 438/303 |

FOREIGN PATENT DOCUMENTS 63-258040 (A) 10/1988 Japan.
6-232119 (A) 8/1994 Japan.

OTHER PUBLICATIONS

Stanley Wolf and Richard N. Tauber, *Silicon Processing for the VLSI Era, vol. 2: Process Integration*, pp. 144–152, 316–319, 397–398, 1990.

Stanley Wolf and Richard N Tauber, *Silicon Processing for the VLSI Era, vol. 3: The Submicron MOSFET*, pp. 641, 1995.

*Primary Examiner*—David B. Hardy
*Attorney, Agent, or Firm*—Timothy M. Honeycutt

[57] ABSTRACT

An integrated circuit transistor and method of making the same are provided. The transistor includes a substrate, first and second source/drain regions, and a gate electrode stack coupled to the substrate. The gate electrode stack is fabricated by forming a first insulating layer on the substrate, forming a first conductor layer on the first insulating layer, and forming a metal layer on the first conductor layer. A second insulating layer, such as an interlevel dielectric layer, is coupled to the substrate adjacent to the gate electrode stack. Sidewall spacers and LDD processing may be incorporated. The transistor and method integrate metal and polysilicon into a self-aligned gate electrode stack.

17 Claims, 5 Drawing Sheets

TRANSISTOR WITH INTEGRATED POLY/METAL GATE ELECTRODE

BACKGROUND OF THE INVENTION

1. Field of the Invention

This invention relates generally to semiconductor processing, and more particularly, to a method of fabricating an integrated circuit transistor with an integrated metal and polysilicon gate electrode stack.

2. Description of the Related Art

Insulated gate field effect transistors ("IGFET"), such as metal oxide semiconductor field effect transistors ("MOSFET"), are some of the most commonly used electronic components in modern integrated circuits. Embedded controllers, microprocessors, analog-to-digital converters, and many other types of devices now routinely include millions of MOSFETs. The dramatic proliferation of MOSFETs in integrated circuit design can be traced to their high switching speeds, potentially low power dissipation, and adaptability to semiconductor process scaling.

A typical MOSFET implemented in silicon consists of a source and a drain formed in a silicon substrate, and separated laterally to define a channel region in the substrate. A gate electrode composed of a conducting material, such as aluminum or polysilicon, is disposed over the channel region and designed to emit an electric field into the channel region. Changes in the electric field emitted by the gate electrode enable, or alternatively, disable the flow of current between the source and the drain.

In a conventional process flow for forming a typical MOSFET, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain. First implant is performed self-aligned to the gate electrode to establish lightly doped drain ("LDD") structures. After the LDD implant, dielectric sidewall spacers are formed adjacent to the gate electrode by depositing and anisotropically etching a dielectric material, such as silicon dioxide. The second of the two source/drain implants is then performed self-aligned to the sidewall spacers. The substrate is then annealed to activate the dopant in the source and the drain. Salicidation steps frequently follow the formation of the source and drain.

Early MOS integrated circuits were implemented as p-channel enhancement mode devices using aluminum as the gate electrode material. Aluminum had the advantages of relatively low resistivity and material cost. Furthermore, there was already a large body of manufacturing experience with aluminum in the chip industry developed from bipolar integrated circuit processing.

A later process innovation that is still widely used today, involved the use of heavily doped polysilicon as a gate electrode material in place of aluminum. The switch to polysilicon as a gate electrode material was the result of certain disadvantages associated with aluminum in early fabrication technologies. In conventional semiconductor fabrication processing, aluminum must be deposited following completion of all high temperature process steps (including drive-in of the source and drain regions). As a result, an aluminum gate electrode must ordinarily be separately aligned to the source and drain. This alignment procedure can adversely affect both packing density and parasitic overlap capacitances between the gate and source/drain regions. Polysilicon, with its much higher melting point, can be deposited prior to source and drain formation and therefore provide for self-aligned gate processing. Furthermore, the high temperature capability of polysilicon is routinely exploited to enable interlevel dielectric layers to be applied to provide multiple metallization layers with improved planarity.

Despite the several advantages of polysilicon over aluminum as a gate electrode material, polysilicon has the disadvantage of a much higher resistivity as compared to aluminum. Higher resistivity translates into higher values of interconnect line resistance that can lead to undesirably long RC time constants and DC voltage variations within VLSI or ULSI circuits. The development of polycide films on top of polysilicon layers has alleviated some of the resistivity shortcomings of polysilicon gate electrodes. However, the resistivity of polysilicon gate electrodes in conventional MOS integrated circuit processing still presents a potential impediment to successful process scaling through reductions in the operating voltages of VLSI and ULSI devices.

Another disadvantage of polysilicon as a gate electrode material is polysilicon depletion. In p-channel transistors, the source and drain are commonly formed in the substrate by implanting a p-type dopant, such as boron. The implant also deposits boron into the polysilicon of the gate electrode. Subsequent thermal processing steps to fabricate a conventional p-channel MOSFET frequently cause boron to diffuse from the gate electrode through the gate oxide layer and into the channel region. If the amount of boron diffused is sufficiently high, the electrical performance of the MOSFET may be severely degraded due to polysilicon depletion.

The present invention is directed to overcoming or reducing one or more of the foregoing disadvantages.

SUMMARY OF THE INVENTION

In accordance with one aspect of the present invention, an integrated circuit transistor is provided. The integrated circuit transistor includes a substrate and first and second source/drain regions in the substrate and being spaced laterally to define a channel region. A gate electrode stack is positioned on the substrate between the first and second sidewall spacers. The gate electrode stack is formed by forming a first insulating layer on the substrate, forming a first conductor layer on the first insulating layer, and forming a metal layer on the first conductor layer. A second insulating layer is positioned on the substrate adjacent to the gate electrode stack that is substantially planar with the metal layer. In accordance with another aspect of the present invention, an integrated circuit transistor is provided. The integrated circuit transistor includes a substrate and first and second source/drain regions in the substrate that are spaced laterally to define a channel region. A gate electrode stack is positioned on the substrate. The gate electrode stack is formed by forming a first insulating layer on the substrate, forming a first conductor layer on the first insulating layer, and forming a metal layer on the first conductor layer. A second insulating layer is positioned on the substrate adjacent to the gate electrode stack that is substantially planar within the metal layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
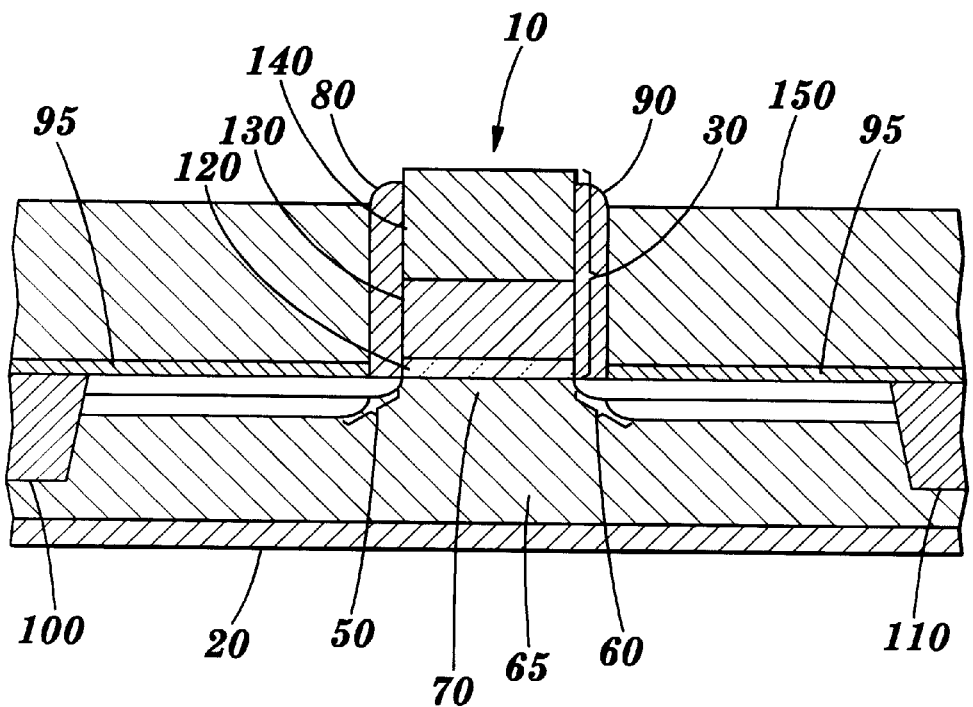
FIG. 1 is a cross-sectional view of an exemplary embodiment of an integrated circuit transistor in accordance with the present invention.

In the drawings described below, reference numerals are generally repeated where identical elements appear in more than one figure. Turning now to the drawings, and initially to FIG. 1, there is shown a cross-sectional view of an exemplary embodiment of an integrated circuit transistor ("transistor") 10 in accordance with the present invention. The transistor 10 may be an IGFET, a MOSFET, or other type of transistor and may be n-channel or p-channel. The transistor 10 is formed on a semiconductor substrate 20 which may be composed of n-doped, or p-doped silicon, silicon-on-insulator, or other suitable substrate materials. The transistor 10 includes a gate electrode stack 30 formed on the substrate 20. First and second source/drain regions 50 and 60 are formed in a well 65 in the substrate 20 and are laterally spaced to define a channel region 70 underlying the gate electrode stack 30. The well 65 may be a N-well or a P-well. Insulating sidewall spacers 80 and 90 are disposed adjacent to the gate electrode stack 30. A silicide layer 95 is formed on the substrate 20 over the source/drain regions 50 and 60.

The phrase "source/drain region(s)" is used herein to describe a region that may serve as either a source or a drain. The person of ordinary skill in the art will appreciate that a source/drain region may function as a source or a drain depending upon whether it is connected to $V_{SS}$ or $V_{DD}$ during metallization.

Isolation trenches 100 and 110 electrically isolate the transistor 10 from other structures in the substrate 20. The isolation trenches 100 and 110 may be fabricated using well known techniques to fabricate isolation trenches, such as, for example, shallow trench isolation and reflow, deep trench isolation, or other suitable trench isolation techniques. The isolation trenches 100 and 110 are advantageously composed of a suitable dielectric material, such as $SiO_2$ or other suitable dielectric trench isolation materials. Conventional LOCOS structures may be alternatively used to provide electrical isolation.

The gate electrode stack 30 includes a first insulating or gate oxide layer 120 formed on the substrate 20, a first conductor layer 130 formed on the first insulating layer 120, and a metal layer 140 formed on the first conductor layer 130. The first insulating layer 120 may be composed of $SiO_2$, or other materials suitable for gate dielectric layers. The first conductor layer 130 is designed to provide a suitable ohmic contact for the metal layer 140. In this regard, the first conductor layer 130 is composed of a combination of a semiconductor material, such as polysilicon, and a silicide compound, such as TiSi, or $CoSi_2$. Depending on the extent of the silicide formation, the layer 130 may be entirely or almost entirely composed of silicide. The metal layer 140 may be composed of a variety of conducting materials suitable for gate electrodes, such as, for example, aluminum, copper, aluminum-copper alloy, or other conducting materials. In an exemplary embodiment, the metal layer 140 is aluminum.

An interlevel dielectric or insulating layer 150 is formed on the substrate 20 exclusive of the gate stack 30 and the spacers 80 and 90. The layer 150 may be composed of tetra-ethyl-ortho-silicate ("TEOS"), spin-on-glass, BPSG, or other suitable interlevel dielectric materials, and is advantageously composed of TEOS.

Figure 2:
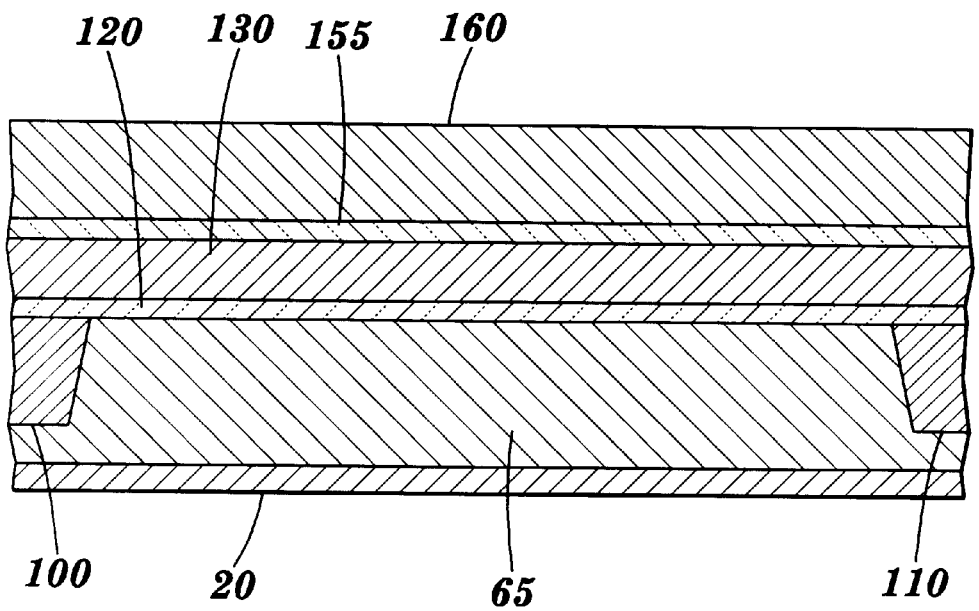
FIG. 2 is a cross-sectional view like FIG. 1 depicting formation of layers constituting a temporary gate stack in accordance with the present invention.

The process flow for fabricating the transistor 10 shown in FIG. 1 may be understood by referring to FIGS. 1, 2, 3, 4, 5, 6, 7 and 8. Referring initially to FIG. 2, the first insulating layer 120 is formed on the substrate 20, and is advantageously composed of $SiO_2$, or other suitable gate oxide material. The first insulating layer 120 may be 20 to 35 Å thick and is advantageously about 25 Å thick. If $SiO_2$ is selected, the first insulating layer 120 may be grown by exposing the substrate 20 to an $O_2$ containing ambient at approximately 800 to 1050° C. for approximately 10 to 60 seconds in a rapid thermal anneal process ("RTA"), or for approximately 5 to 20 minutes in a diffusion tube process. A nitrogen bearing species, such as NO or $N_2O$, may be added to the ambient to infuse nitrogen into the layer 120 to inhibit polysilicon depletion and reduce hot carrier effects.

The first conductor layer 130 is formed on the first insulating layer 120, and may be composed of a variety of conducting materials, such as, for example, amorphous silicon or polysilicon. In an exemplary embodiment, the first conductor layer 130 is polysilicon. Well known techniques for applying polysilicon, such as CVD, may be used to deposit the first conductor layer 130. In an exemplary embodiment, the polysilicon is deposited at or above about 625° C. to a thickness of 20 to 300 Å, and advantageously to about 160 Å.

A second insulating layer 155 is formed on the first conductor layer 130, and is advantageously composed of $SiO_2$, or other suitable dielectric materials. The second insulating layer 155 may be 10 to 50 Å thick and is advantageously about 10 Å thick. If $SiO_2$ is selected, the second insulating layer 155 may be formed using the same techniques described above in conjunction with the first insulating layer 120. As described below, the second insulating layer 155 serves as an etch stop during subsequent processing.

A second conductor layer 160 is formed on the second insulating layer 155. The second conductor layer 160 may be composed of the same materials and processed in the same way as described above in conjunction with the first conductor layer 130. In an exemplary embodiment, the second conductor layer 160 is polysilicon deposited at or above about 625° C. to a thickness of 1000 to 2000 Å, and advantageously to about 1300 Å.

Figure 3:
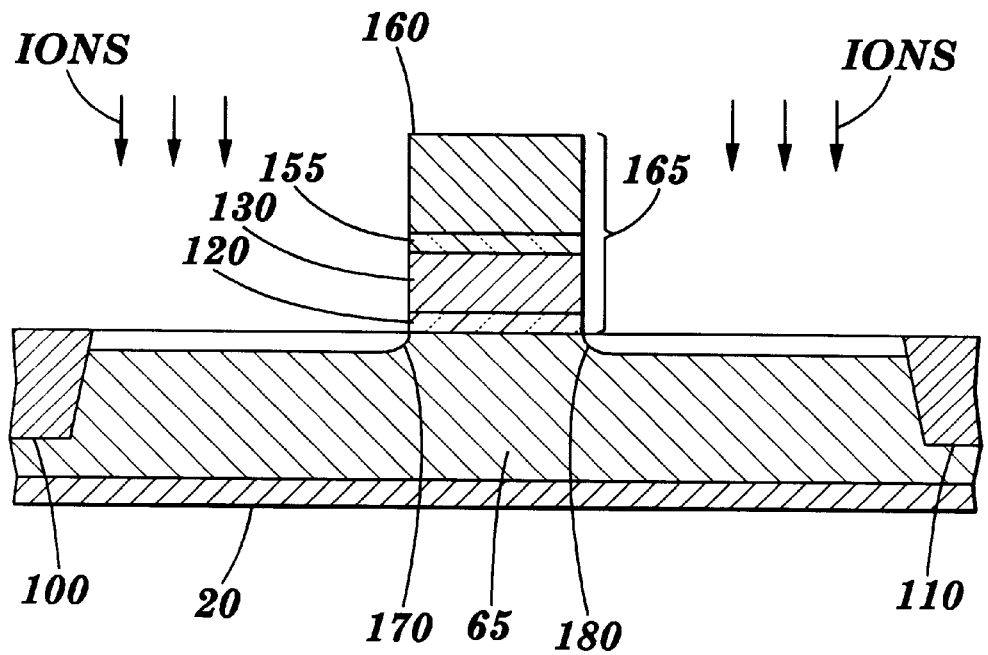
FIG. 3 is a cross-sectional view like FIG. 1 following definition of the temporary gate stack and formation of source/drain regions in accordance with the present invention.

Referring now to FIG. 3, the substrate 20 is masked with a photoresist, patterned, and anisotropically etched by reactive ion or plasma etching to yield a temporary stack 165. The total thickness of the temporary stack 165 will depend on thicknesses of the various constituent layers 120, 130, 155, and 160. In an exemplary embodiment, the temporary stack 165 is advantageously about 1500 Å thick.

Following definition of the temporary stack 165, implants to adjust the threshold voltage $V_T$ of the transistor 10 (see FIG. 1) and to inhibit punchthrough may be performed. The energy and dosage for the $V_T$ adjust and punchthrough inhibitor implants will depend on the dopant species. For p-type dopants, such as boron, the dosage for the threshold voltage adjust implant may be 2E12 to 7E12 ions/cm$^2$ and is advantageously 7E12 ions/cm$^2$. The energy may be 10 to 30 keV and is advantageously 20 keV. For n-type dopants, such as phosphorus, the energy may be 30 to 70 keV and is advantageously 50 keV. For p-type dopants, such as boron, the dosage for the punchthrough inhibitor implant may be 1E12 to 1E13 ions/cm$^2$ and is advantageously 6E12 ions/cm$^2$. The energy may be 40 to 70 keV and is advantageously 50 keV. For n-type dopants, such as phosphorus, the energy may be 80 to 120 keV and is advantageously 100 keV.

The source/drain regions 50 and 60 are advantageously formed by ion implantation. In an exemplary embodiment, a two-step implant is used. The substrate 20 is implanted with a dopant species to form the lightly doped drain ("LDD") structures 170 and 180 that are self-aligned to the temporary stack 160. The energy and dosage of the LDD implant will depend upon the dopant type. In an exemplary embodiment for n-channel, the dopant is arsenic. The dosage may be 5E13 to 8E14 ions/cm$^2$ and is advantageously 4E14 ions/cm$^2$. The energy may be 5 to 30 keV and is advantageously 20 keV. The implant angle is advantageously 0°.

Figure 4:
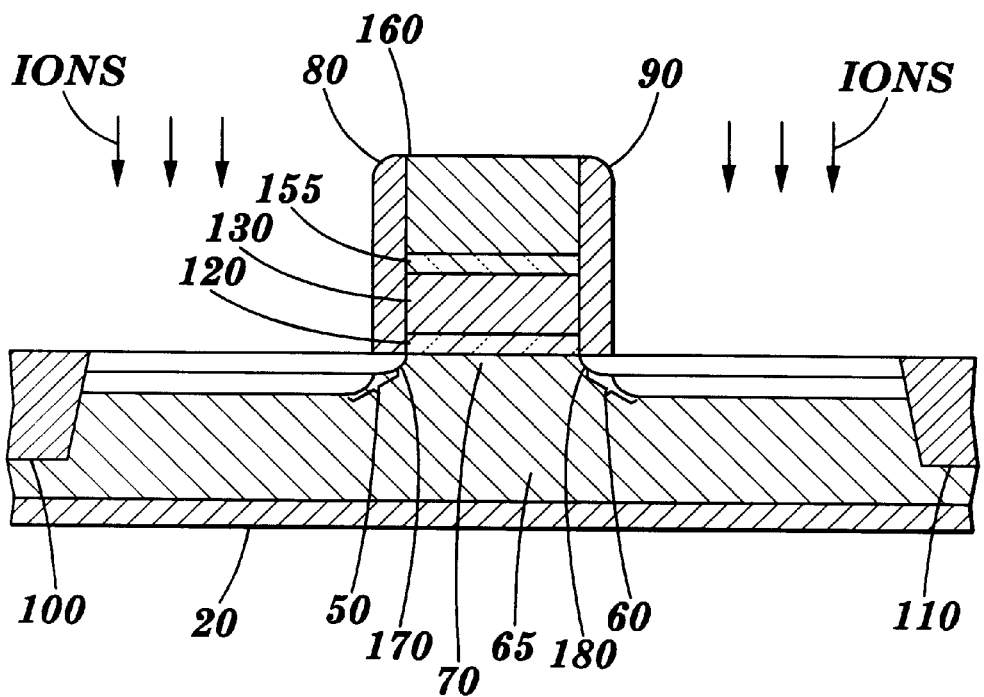
FIG. 4 is a cross-sectional view like FIG. 1 depicting formation of sidewall spacers in accordance with the present invention.

Referring now to FIG. 4, the insulating sidewall spacers 80 and 90 are formed adjacent to the temporary stack 165 and may be composed of a suitable sidewall spacer material, such as, for example, SiO$_2$, Si$_3$N$_4$, or similar suitable sidewall spacer materials. The spacers 80 and 90 may be fabricated by forming a layer of the selected material by oxidation, chemical vapor deposition ("CVD"), or other technique, followed by anisotropic etching to leave the spacers 80 and 90. The spacers 80 and 90 are advantageously Si$_3$N$_4$, may be 200 to 800 Å wide and are advantageously about 500 Å wide.

Following formation of the sidewall spacers 80 and 90, a second implant is performed self-aligned to the sidewall spacers 80 and 90 to establish the source/drain regions 50 and 60. The energy and dosage of the S/D implant will depend upon the dopant type. In an exemplary embodiment, the dopant is arsenic. The dosage may be 2E15 to 7E15 ions/cm$^2$ and is advantageously 4E15 ions/cm$^2$. The energy may be 5 to 50 keV and is advantageously 40 keV. The implant angle is advantageously 0°. Like the $V_T$ and punchthrough implants, the energy of the S/D and LDD implants will be proportionately different for different dopant species.

Figure 5:
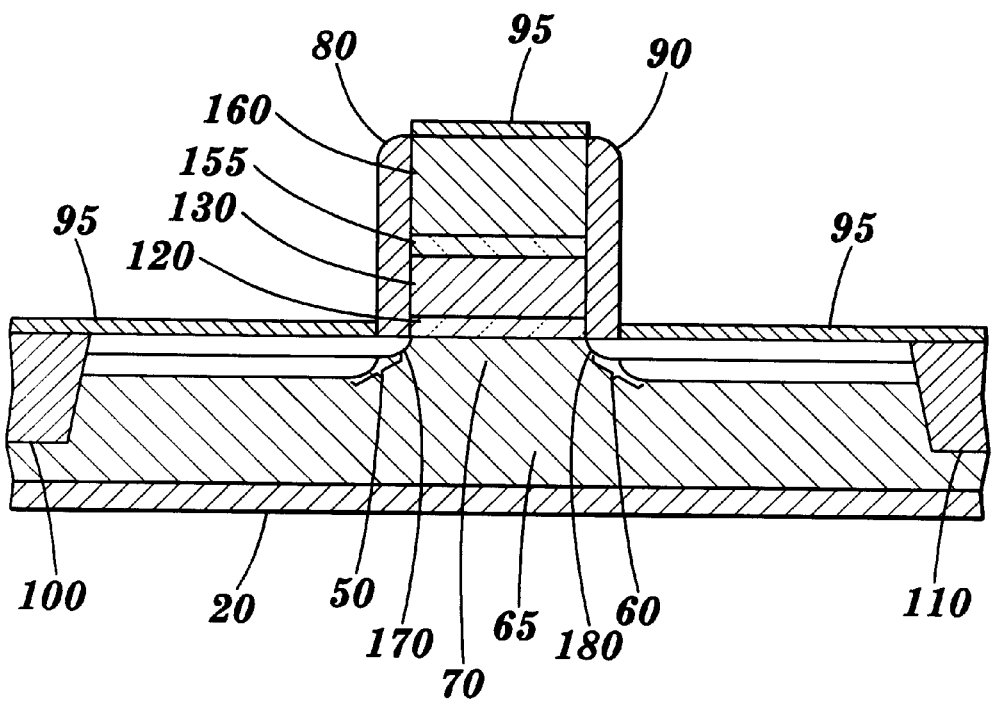
FIG. 5 is a cross-sectional view like FIG. 1 depicting salicidation processing in accordance with the present invention.

Referring now to FIG. 5, the silicide layer 95 is established by a salicidation process. A suitable silicide forming material, such as titanium, is deposited on the substrate 20 by CVD. The titanium is annealed in an inert ambient at approximately 650 to 700° C. for approximately 30 to 60 seconds in an RTA. The inert gas may be N$_2$, argon or other suitable inert gas, and is advantageously N$_2$. The resulting silicide layer 95 may have a thickness of 250 to 500 Å and advantageously about 375 Å. Following the titanium deposition, the substrate 20 may be subjected to RCA cleaning to remove any unreacted titanium from the spacers 80 and 90, followed by a final anneal at approximately 700 to 800° C. for approximately 30 to 60 seconds.

The high temperature thermal step to form the silicide layer 95 also serves to anneal the source/drain regions 50 and 60. Note that the arsenic dopant in the source/drain regions 50 and 60 will diffuse laterally beneath the first insulating layer 120, defining the channel region 70. The lateral diffusion of the dopant establishes a lightly doped region for each source/drain region 50 and 60 that is adjacent the channel 70.

Figure 6:
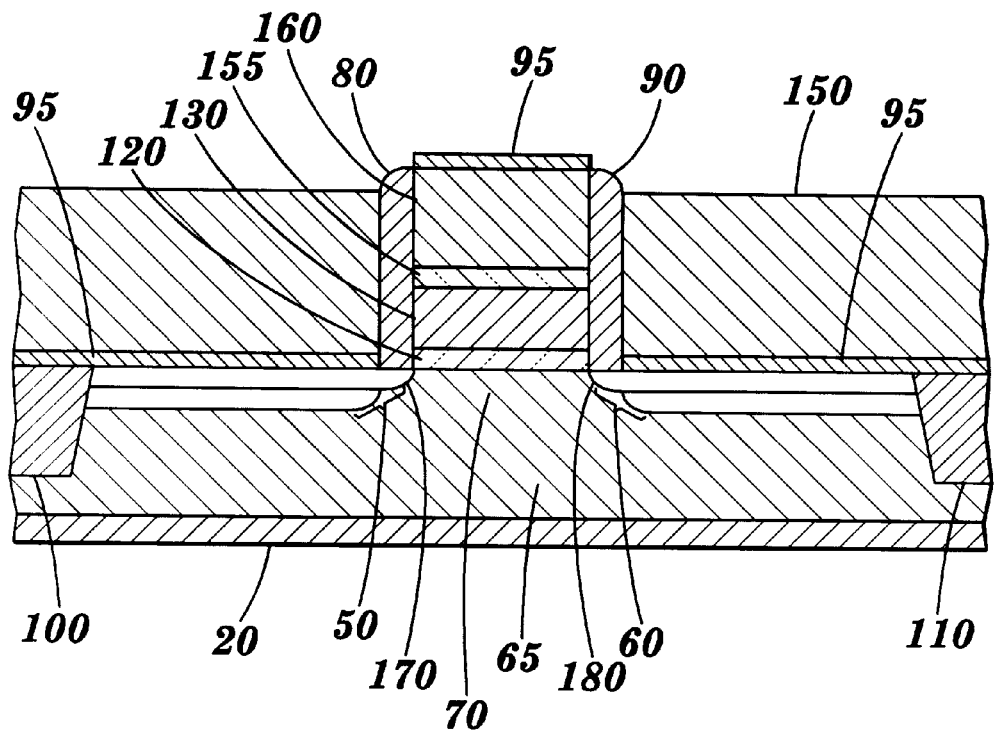
FIG. 6 is a cross-sectional view like FIG. 1 depicting formation of an interlevel dielectric or insulating layer in accordance with the present invention.

Referring now to FIG. 6, the interlevel dielectric or insulating layer 150 is formed on the substrate 20 by CVD. The layer 150 may be 0.75 $\mu$m to 1.2 $\mu$m thick and is advantageously about 1.0 $\mu$m thick. Follow deposition, the layer 150 is planarized to slightly below the tops of the spacers 80 and 90 by chemical-mechanical-polishing ("CMP") or other planarization techniques.

Figure 7:
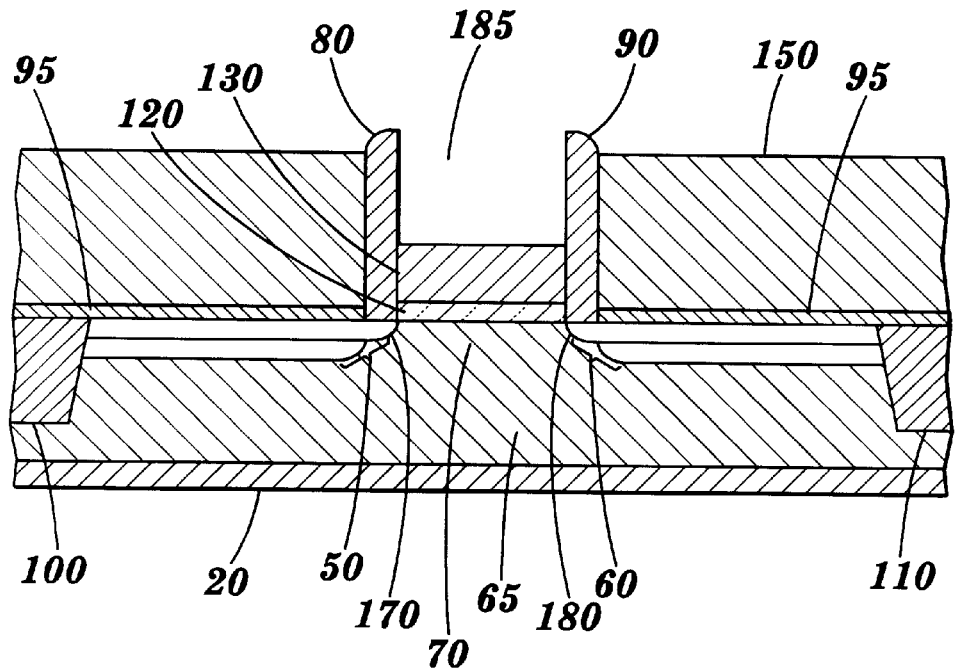
FIG. 7 is a cross-sectional view like FIG. 1 depicting removal of some of the constituent layers of the temporary stack in accordance with the present invention.

Referring now to FIG. 7, the second conductor layer 160 and the portion of the silicide layer 95 overlying the second conductor layer 160 are removed by etching. Plasma etching, reactive ion etching, or wet etching with an etchant, such as HF in a 10 to 1 or other suitable ratio, may be used. The second insulating layer 155 serves as an etch stop to protect the first conductor layer 130, independent of the particular etching process used to remove the layer 160. After removal of the second conductor layer 160, the second insulating layer 155 is removed using the same types of etching techniques. A void 185 is left between the spacers 80 an 90 and above the layer 130.

Figure 8:
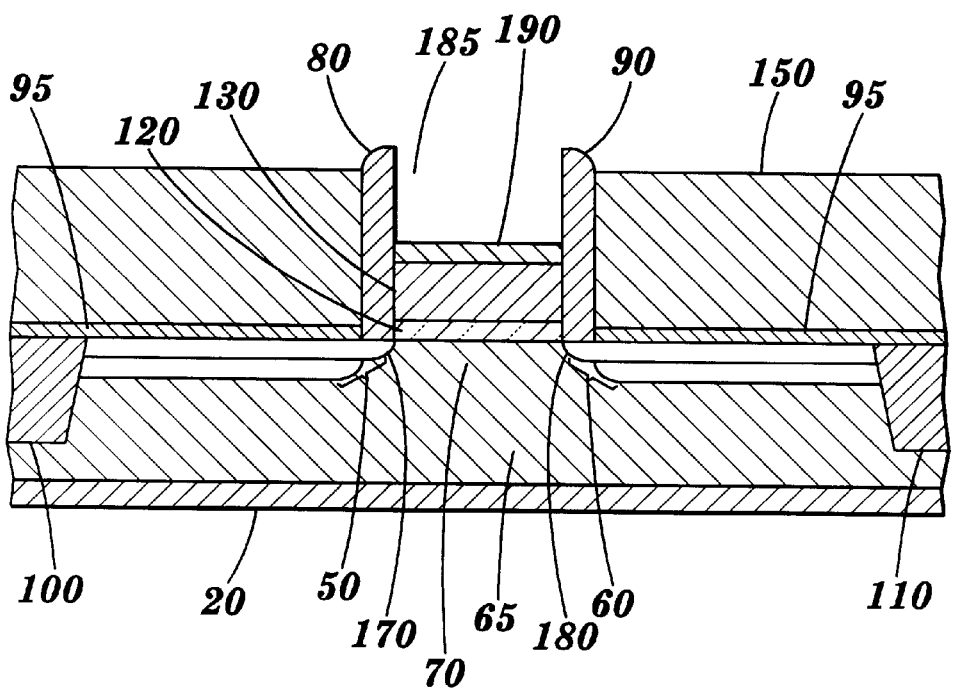
FIG. 8 is a cross-sectional view like FIG. 1 depicting formation of a silicide layer on the temporary stack.

Enhanced ohmic contact between the metal layer 140 (see FIG. 1) and the first conductor layer 130 by converting some or all of the first conductor layer 130 into silicide. As shown in FIG. 8, a suitable silicide forming material, such as titanium or other refractory metal, is deposited on the first conductor layer 130 by CVD. The titanium layer 190 is annealed in an inert ambient at approximately 650 to 700° C. for approximately 30 to 60 seconds in an RTA. The inert gas may be N$_2$, argon or other suitable inert gas, and is advantageously N$_2$. In forming the silicide, it is desirable for the reaction to consume all or nearly all of the polysilicon of the layer 130. The silicide reaction follows a generally 1:2 ratio of titanium to polysilicon, that is, 1 Å of deposited titanium will react with and consume 2 Å of polysilicon. As the first conductor layer 130 may be 20 to 300 Å thick and is advantageously about 160 Å thick, the titanium layer 190 may be deposited to a thickness of 10 to 150 Å, and advantageously to about 80 Å. Following silicide formation, the substrate 20 may be subjected to RCA cleaning to remove any unreacted titanium from the spacers 80 and 90 and the insulating layer 150, and a final anneal at approximately 700 to 800° C. for approximately 30 to 60 seconds.

Referring again to FIG. 1, the metal layer 140 is formed by depositing metal on the layer 150 and in the void 185 left by the removal of the second conductor layer 160 and the second insulating layer 155 (see FIG. 7). The deposited metal is planarized back substantially to the spacers 80 and 90 by CMP or other suitable planarization technique to yield the metal layer 140 and the completed gate electrode stack 30.

Figure 9:
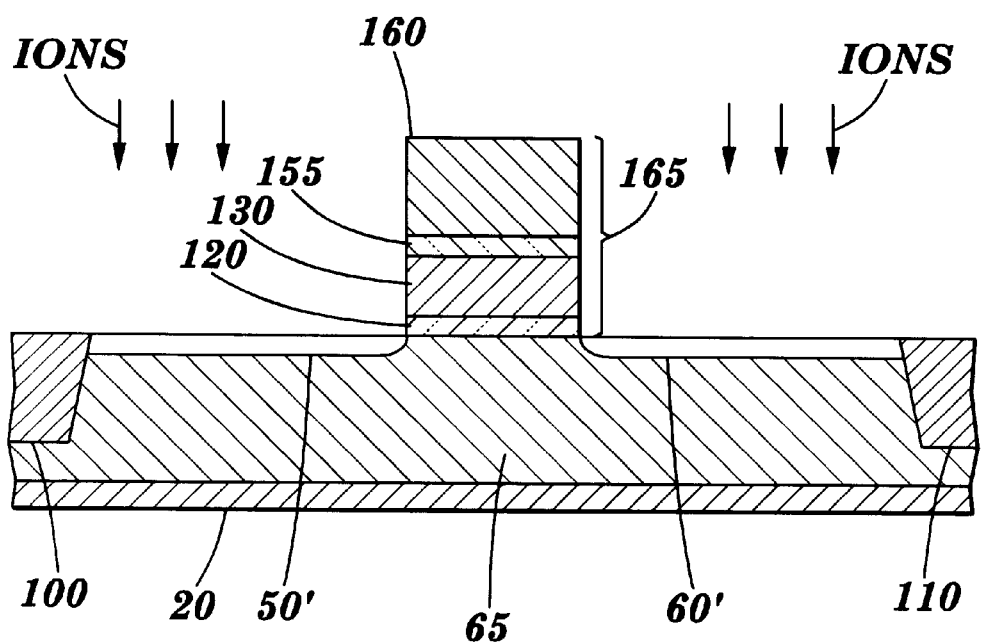
FIG. 9 is a cross-sectional view like FIG. 3 of an alternate embodiment of the transistor following temporary stack formation.
Figure 10:
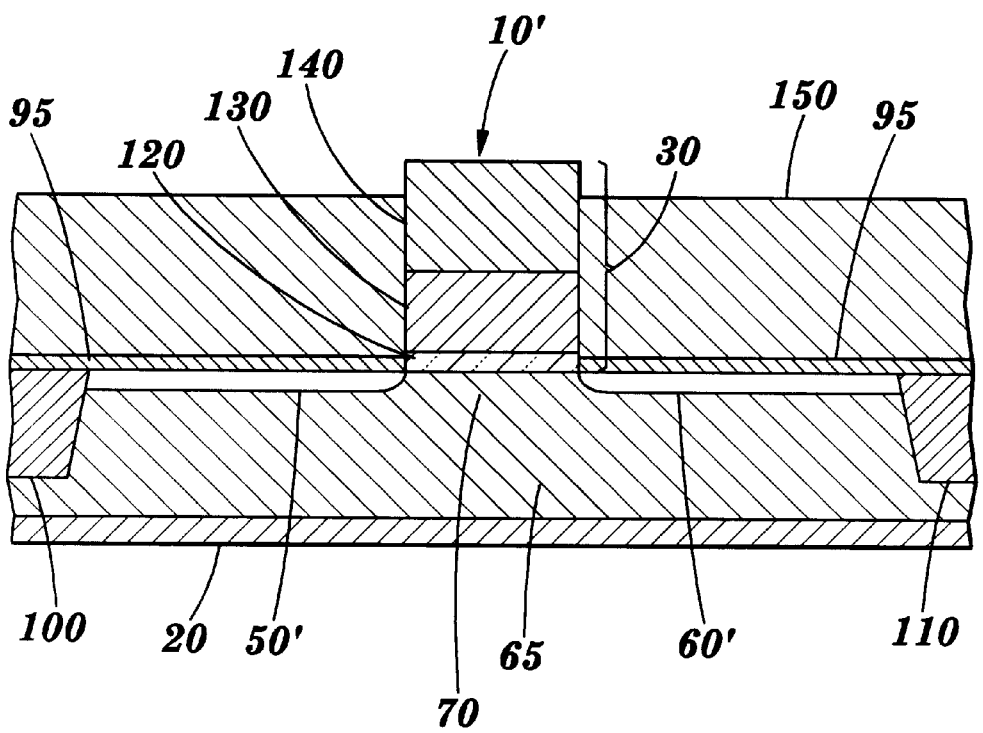
FIG. 10 is a cross-sectional view like FIG. 1 of the alternate embodiment of the transistor following formation of the metal layer.

FIGS. 9 and 10 depict the structure and process flow for an alternate embodiment of the transistor, now designated 10'. FIG. 9 is a cross-sectional view like FIG. 3, and FIG. 10 is a cross-sectional view like FIG. 1. Referring initially to FIG. 10, this alternate embodiment does not incorporate the sidewall spacers 80 and 90 depicted in FIGS. 1 through 8 and the insulating layer 150 is formed adjacent to, that is, on either side of the gate electrode stack 30. In addition, the source/drain regions, now designated 50' and 60', are formed in a single implant process.

The process flow leading to the definition of the temporary stack 165 proceeds initially as generally described above in conjunction with FIGS. 1 and 2. Referring now to FIG. 9, following an etch to define the temporary stack 165, the implant for the source/drain regions 50' and 60' is performed. The energy and dosage of the S/D implant will depend upon the dopant type. In an exemplary embodiment, the dopant is arsenic. The dosage may be 2E15 to 7E15 ions/cm$^2$ and is advantageously 4E15 ions/cm$^2$. The energy may be 5 to 50 keV and is advantageously 30 keV. The implant angle is advantageously 0°. Following the implant, the silicide layer 95 and the insulating layer 150 are formed, the temporary stack 165 is etched, and the metal layer 140 is formed, all as generally described above to yield the transistor 10' shown in FIG. 10.

The process in accordance with the present invention yields a transistor with a gate electrode integrating metal and silicide in a self-aligned stack. The result is a gate electrode with significantly enhanced conductivity over a conventional polysilicon gate electrode. If the transistor 10 or 10' is implemented in p-channel, the potential for polysilicon depletion is partially or completely eliminated. Self-alignment with metal is achieved by using high temperature resistant materials, such as polysilicon and SiO$_2$, to form a temporary stack that can withstand the annealing associated with the salicidation and interlevel dielectric formation processes. Subsequent sacrifice of a portion of the temporary stack provides a self-aligned void for the metal layer.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An integrated circuit transistor, comprising:

a substrate;

first and second source/drain regions in the substrate and being spaced laterally to define a channel region;

a gate electrode stack positioned on the substrate and having a first insulating layer, a first conductor layer including a silicide layer positioned on a polysilicon layer, and a metal layer on the first conductor layer; and a second insulating layer positioned on the substrate adjacent to the gate electrode stack and being substantially planar with the metal layer.

2. The integrated circuit transistor of claim 1, comprising first and second insulating sidewall spacers positioned on the substrate adjacent to the gate electrode stack.

3. The integrated circuit transistor of claim 2, wherein the metal layer is substantially planar with the first and second sidewall spacers.

4. The integrated circuit transistor of claim 1, wherein the metal layer comprises aluminum or aluminum-alloy.

5. The integrated circuit transistor of claim 1, wherein the metal layer comprises aluminum, aluminum-alloy or copper.

6. The integrated circuit transistor of claim 1, wherein the metal layer comprises aluminum, aluminum-alloy or copper.

7. An integrated circuit transistor comprising:

a substrate;

first and second source/drain regions in the substrate and being spaced laterally to define a channel region;

a gate electrode stack positioned on the substrate and having a first insulating layer, a silicide layer, and a metal layer on the silicide layer; and a second insulating layer positioned on the substrate adjacent to the gate electrode stack and being substantially planar with the metal layer.

8. The integrated circuit transistor of claim 7, comprising first and second insulating sidewall spacers positioned on the substrate adjacent to the gate electrode stack.

9. The integrated circuit transistor of claim 8, wherein the metal layer is substantially planar with the first and second sidewall spacers.

10. The integrated circuit transistor of claim 7, wherein the metal layer comprises aluminum, aluminum-alloy or copper.

11. An integrated circuit transistor, comprising:

a substrate;

first and second source/drain regions in the substrate and being spaced laterally to define a channel region;

a gate electrode stack coupled to the substrate, the gate electrode stack being formed by forming a first insulating layer on the substrate, forming a first conductor layer on the first insulating layer, the first conductor layer including a silicide layer positioned on a polysilicon layer and forming a metal layer on the first conductor layer; and a second insulating layer positioned on the substrate adjacent to the gate electrode stack and being substantially planar with the metal layer.

12. The integrated circuit transistor of claim 11, comprising first and second insulating sidewall spacers positioned on the substrate adjacent to the gate electrode stack.

13. The integrated circuit transistor of claim 12, wherein the metal layer is formed by planarizing the metal layer substantially to the sidewall spacers by chemical mechanical polishing.

14. The integrated circuit transistor of claim 11, wherein the metal layer is formed by forming a third insulating layer on the first conductor layer and a second conductor layer on the second insulating layer, removing the second conductor and insulating layers, and depositing the metal layer on the first conductor layer.

15. The integrated circuit transistor of claim 11, wherein the the first conductor ayer is formed by forming a silicide layer on the first conductor layer prior to application of the metal layer.

16. The integrated circuit transistor of claim 11, wherein the metal layer is formed by planarizing the metal layer substantially to the second insulating layer by chemical mechanical polishing.

17. The integrated circuit transistor of claim 11, wherein the metal layer comprises aluminum or aluminum-alloy.

* * * * *

UNITED STATES PATENT AND TRADEMARK OFFICE
CERTIFICATE OF CORRECTION

PATENT NO: 6,118,163

DATED: September 12, 2000

INVENTOR(S): Mark I. Gardner et al.

It is hereby certified that error appears in the above-identified patent and that said Letters Patent is hereby corrected as shown below:

In column 6, line 22, delete "Follow" and substitute --Following the-- therefor;

In column 6, line 39, insert the phrase --may be provided-- between the number "130" and the word "by"; and In claim 26, delete the phrase "the the first conductor ayer" and substitute the phrase --the first conductor layer-- therefor.

Signed and Sealed this

First Day of May, 2001

*Attest:*

NICHOLAS P. GODICI

*Attesting Officer*  *Acting Director of the United States Patent and Trademark Office*